United States Patent
Joseph et al.

(10) Patent No.: US 6,888,221 B1
(45) Date of Patent: May 3, 2005

(54) BICMOS TECHNOLOGY ON SIMOX WAFERS

(75) Inventors: Alvin J. Joseph, Williston, VT (US); Qizhi Liu, Essex Junction, VT (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,114

(22) Filed: Apr. 14, 2004

(51) Int. Cl.⁷ .............................................. H01L 27/082
(52) U.S. Cl. ...................... 257/565; 257/592; 438/205; 438/313; 438/340
(58) Field of Search ................................. 257/565–575, 257/592, 523, 524; 438/205, 313, 340

(56) References Cited

U.S. PATENT DOCUMENTS

| | | | |
|---|---|---|---|
| 4,997,776 A | 3/1991 | Harame et al. | |
| 5,118,634 A | 6/1992 | Neudeck et al. | |
| 5,698,890 A | 12/1997 | Sato | |
| 6,441,462 B1 * | 8/2002 | Lanzerotti et al. | |
| 6,486,532 B1 | 11/2002 | Racanelli | |
| 6,521,974 B1 * | 2/2003 | Oda et al. | 257/593 |
| 2002/0177253 A1 | 11/2002 | Johnson et al. | |
| 2003/0094673 A1 | 5/2003 | Dunn et al. | |
| 2003/0098465 A1 | 5/2003 | Suzumura et al. | |

* cited by examiner

*Primary Examiner*—Fetsum Abraham
(74) *Attorney, Agent, or Firm*—McGinn & Gibb, PLLC; Anthony Canale

(57) ABSTRACT

A method and structure for a bipolar transistor comprising a patterned isolation region formed below an upper surface of a semiconductor substrate and a single crystal extrinsic base formed on an upper surface of the isolation region. The single crystal extrinsic base comprises a portion of the semiconductor substrate located between the upper surface of the isolation region and the upper surface of the semiconductor substrate. The bipolar transistor further comprises a single crystal intrinsic base, wherein a portion of the single crystal extrinsic base merges with a portion of the single crystal intrinsic base. The isolation region electrically isolates the extrinsic base from a collector. The intrinsic and extrinsic bases separate the collector from an emitter. The extrinsic base comprises epitaxially-grown silicon. The isolation region comprises an insulator, which comprises oxide, and the isolation region comprises any of a shallow trench isolation region and a deep trench isolation region.

30 Claims, 10 Drawing Sheets

Figure 3(b)
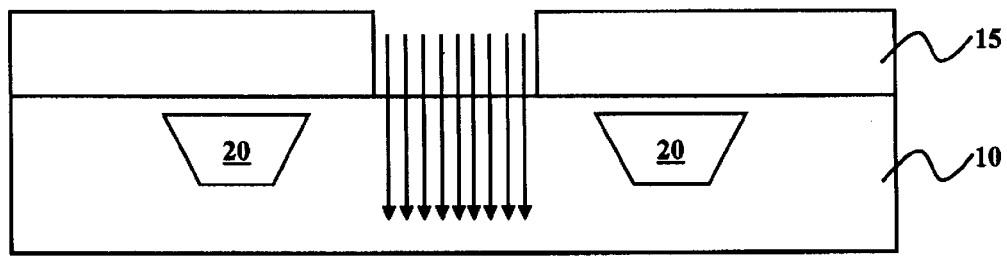
Figure 4(a)           Figure 4(b)
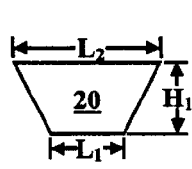 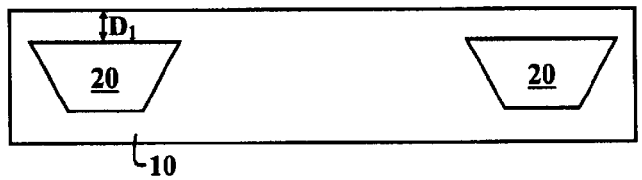
Figure 5(a)
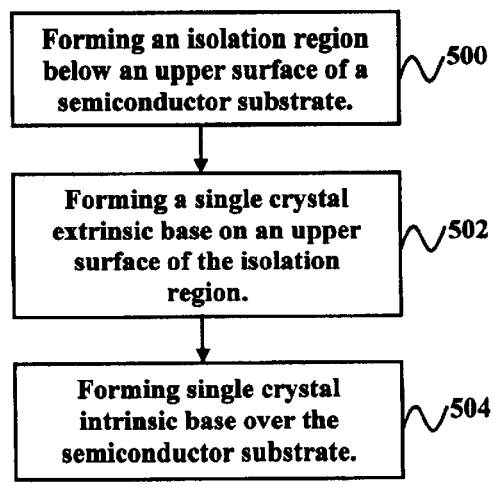

BICMOS TECHNOLOGY ON SIMOX WAFERS

BACKGROUND OF INVENTION

1. Field of the Invention

The invention generally relates to BiCMOS (bipolar complimentary metal oxide semiconductor) technologies, and more particularly to a bipolar transistor device using SOI (semiconductor-on-insulator) wafers.

2. Description of the Related Art

Conventional CMOS (complimentary metal oxide semiconductor) technologies using single crystal silicon as an intrinsic base in an SOI structure are described in U.S. Pat. No. 5,118,634, issued to Neudeck et al. on Jun. 2, 1992 and Burghartz, J. N. et al., "SOI Bipolar Structure and the Fabrication Processes For Same," IBM Technical Disclosure Bulletin, Vol. 35, No. 6, pp. 10–13, November 1992, the complete disclosures of which, in their entireties, are herein incorporated by reference.

Other conventional HBT (heterojunction bipolar) devices utilize a LTE (low temperature epitaxy) SiGe (Silicon Germanium) base grown on silicon bounded by a STI (shallow trench isolation) region. Characteristics of these devices include a single-crystalline SiGe intrinsic base and a polycrystalline extrinsic base consisting of polysilicon over the STI region, which renders the resulting NPN (or PNP) geometry non-planar, and in fact quite bumpy. Also, there is a transitional faceted region disposed in between the intrinsic and extrinsic bases. However, this link region is highly resistive, which adversely impacts device performance. Moreover, for CMOS designers there remains a big challenge in optimizing the photolithography processes for these devices when the devices are scaled down.

Neudeck teaches a vertical bipolar transistor using a single crystal extrinsic base contact to reduce the base resistance. Specifically, Neudeck teaches that the extrinsic base layer and insulator layers are over the substrate layer. Similarly, Burghartz teaches single crystal silicon as an extrinsic base in a SOI structure. Moreover, Burghartz teaches that the extrinsic base is on the insulator layer (such as $SiO_2$), which is then configured on the substrate (e.g., a Si substrate). However, neither Neudeck, Burghartz, nor any of the other conventional devices teach a bipolar transistor having a single crystal extrinsic base and isolation regions formed in the substrate.

While, these devices were sufficient for the purposes they were designed, they do not provide optimum configurations for reducing the base resistance in the device. In addition, forming an isolation layer in Si substrates has been shown to be the most dominant approach in manufacturing due to the process simplicity. Therefore, due to the limitations of the conventional devices, there is a need for a practical and simple device and methodology that integrates SiGe HBTs with epitaxial extrinsic bases on SIMOX (separation by implanted oxygen) substrates and which overcomes the deficiencies of the conventional devices and methodologies.

SUMMARY OF INVENTION

In view of the foregoing, an embodiment of the invention provides a bipolar transistor comprising a patterned isolation region formed below an upper surface of a semiconductor substrate and a single crystal extrinsic base formed on an upper surface of the isolation region. The single crystal extrinsic base comprises a portion of the semiconductor substrate located between the upper surface of the isolation region and the upper surface of the semiconductor substrate. The bipolar transistor further comprises a single crystal intrinsic base, wherein a portion of the single crystal extrinsic base merges with a portion of the single crystal intrinsic base. Moreover, the isolation region electrically isolates the single crystal extrinsic base from a collector. Additionally, the single crystal intrinsic and extrinsic bases separate the collector from an emitter. Furthermore, the single crystal extrinsic base comprises epitaxially-grown silicon. Also, the isolation region comprises an insulator, wherein the insulator comprises oxide, and the isolation region comprises any of a shallow trench isolation region and a deep trench isolation region.

Additionally, according to the invention a bipolar transistor comprises a semiconductor substrate, a sub-collector in the semiconductor substrate, a collector adjacent the sub-collector, a patterned isolation region encapsulated within the semiconductor substrate, a single crystal extrinsic base over the isolation region, and an emitter adjacent the single crystal extrinsic base, wherein the single crystal extrinsic base comprises a portion of the semiconductor substrate located between an upper surface of the isolation region and an upper surface of the semiconductor substrate. The bipolar transistor further comprises a single crystal intrinsic base, wherein a portion of the single crystal extrinsic base merges with a portion of the single crystal intrinsic base, wherein the isolation region electrically isolates the single crystal extrinsic base from the collector, and wherein the single crystal intrinsic and extrinsic bases separate the collector from the emitter. Moreover, the single crystal extrinsic base comprises epitaxially-grown silicon, and the isolation region comprises an insulator, wherein the insulator comprises oxide. Also, the isolation region comprises any of a shallow trench isolation region and a deep trench isolation region.

According to another embodiment, the invention provides a method of forming a bipolar transistor, wherein the method comprises forming a patterned isolation region below an upper surface of a semiconductor substrate, forming a single crystal extrinsic base on an upper surface of the isolation region, and forming single crystal intrinsic base over the semiconductor substrate, wherein a portion of the single crystal extrinsic base merges with a portion of the single crystal intrinsic base, and wherein the single crystal extrinsic base comprises a portion of the semiconductor substrate located between the upper surface of the isolation region and the upper surface of the semiconductor substrate.

Additionally, according to the invention a method of manufacturing a bipolar transistor comprises performing an oxygen implant to form a patterned isolation layer underneath a substrate surface, forming a single crystalline intrinsic base over the substrate, depositing insulator layers over the single crystalline intrinsic base, selectively etching portions of the insulator layers to expose portions of the single crystalline intrinsic base, and forming a single crystalline extrinsic base over exposed portions of the single crystalline intrinsic base. The method further comprises converting any polycrystalline portions and a portion of the single crystalline extrinsic base of the bipolar transistor into oxide by performing a high pressure oxidation process over the single crystalline extrinsic base, removing excess portions of the oxide, and forming an oxide isolation layer over the single crystalline extrinsic base by performing a second high pressure oxidation process over the single crystalline extrinsic base, wherein the insulator layers comprise a silicon nitride layer deposited over a silicon dioxide layer. The method further comprises removing remaining portions of the silicon nitride layer, forming a pair of isolation spacers adjacent a sidewall of the single crystalline extrinsic base and the oxide isolation layer and over the silicon dioxide layer, removing exposed portions of the silicon dioxide layer unprotected by the isolation spacers thereby exposing the single crystalline intrinsic base, and defining an emitter region over the single crystalline intrinsic base, wherein the single crystalline extrinsic base comprises a portion of the substrate located between an upper surface of the patterned isolation layer and an upper surface of the substrate, and wherein a portion of the single crystalline extrinsic base merges with a portion of the single crystalline intrinsic base.

The invention relates to the state of the art CMOS technologies that are using SOI wafers. One main source of SOI wafers are from SIMOX. Building SiGe HBTs on SOI substrates takes advantage of the low power consumption of SOI technology and high current driverability of SiGe HBTs. The invention uses patterned SIMOX for BiCMOS isolation. This enables SiGe HBTs with planar structures. The invention achieves several advantages, such as a new and simple integration scheme that can be used for planar SiGe HBTs. Also, the invention achieves a much improved photolithography process on planar SiGe HBTs, especially as devices are scaled down. Moreover, the invention allows for reduced effect levels on planar SiGe HBTs and improves device yield. Moreover, according to the invention, CMOS are built at different regions on the same SIMOX wafers thereby providing a simple SiGe SOI technology.

These, and other, aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF DRAWINGS

The invention will be better understood from the following detailed description with reference to the drawings, in which:

FIG. 3(b) is a schematic diagram showing a cross-sectional segmented view of a device illustrating a fourth embodiment of the invention;

FIGS. 4(a) and 4(b) are schematic diagrams showing a cross-sectional segmented view of a geometric configuration of a device according to an embodiment of the invention; and FIGS. 5(a) through 5(d) are flow diagrams illustrating preferred methods of the invention.

DETAILED DESCRIPTION

Figure 1A:
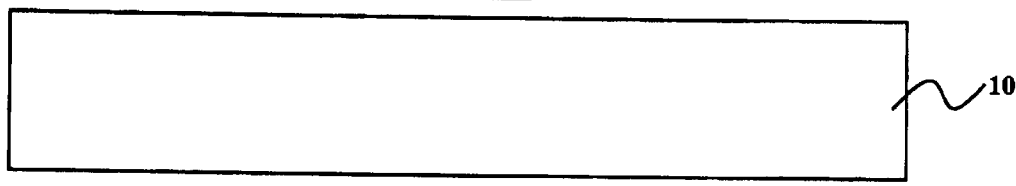
FIGS. 1(a) through 1(r) are schematic diagrams showing a cross-sectional segmented view of a device illustrating, in different steps of the fabrication process, an embodiment of the invention.

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

As previously mentioned, there is a need for a practical and simple device and methodology that integrates SiGe HBTs on SIMOX substrates and which overcomes the deficiencies of the conventional devices and methodologies. Referring now to the drawings, and more particularly to FIGS. 1(a) through 5(d), there are shown preferred embodiments of the invention.

Figure 1B:
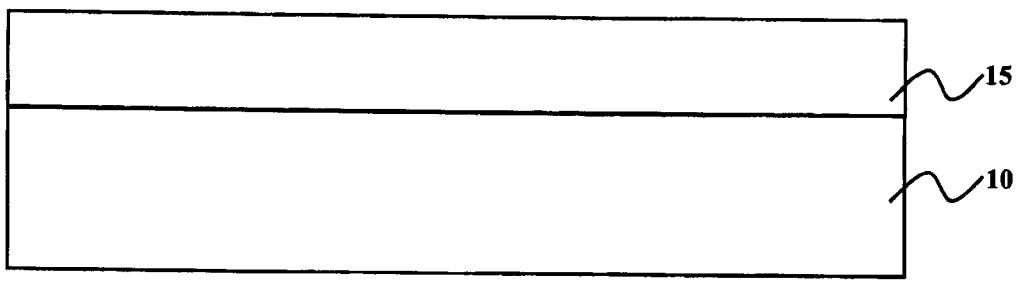
Figure 1C:
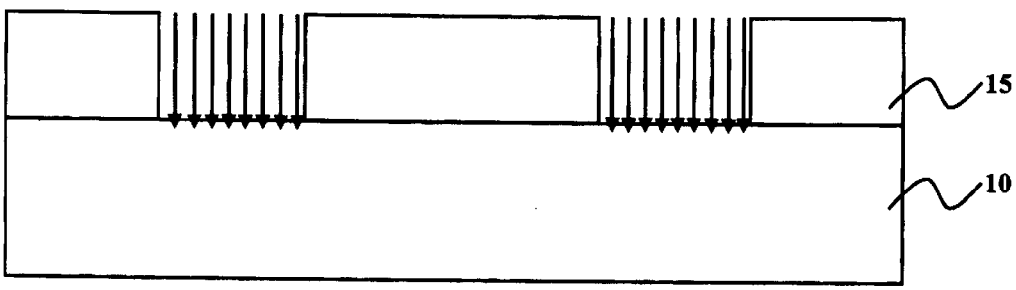
Figure 1D:
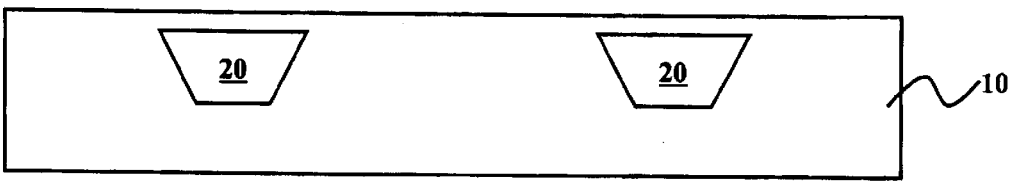

According to the invention, a bipolar transistor is fabricated beginning with a semiconductor wafer (substrate) 10 as shown in FIG. 1(a). The substrate 10 is preferably silicon, for example a P-type single crystal (monocrystalline) silicon substrate may be used, however, those skilled in the art would understand that any semiconductor material may be used, and any type of substrate may be used such as a N+ buried layer used to form a subcollector and formed over a semiconductor substrate, and the substrate may be a semiconductor-on-insulator (SOI) substrate. A typical NPN substrate is formed according to the invention, although a PNP device may also be formed. FIG. 1(b) illustrates a photoresist layer 15 formed upon the substrate 10. Thereafter, portions of the photoresist layer 15 are selectively removed to expose portions of the underlying substrate 10 to allow for a medium dose oxygen implant/high temperature annealing process to occur as depicted in FIG. 1(c) (arrows representing the oxygen implant), which forms a patterned isolation layer 20 underneath the surface of the substrate 10 as further illustrated in FIG. 1(d).

Figure 2A:
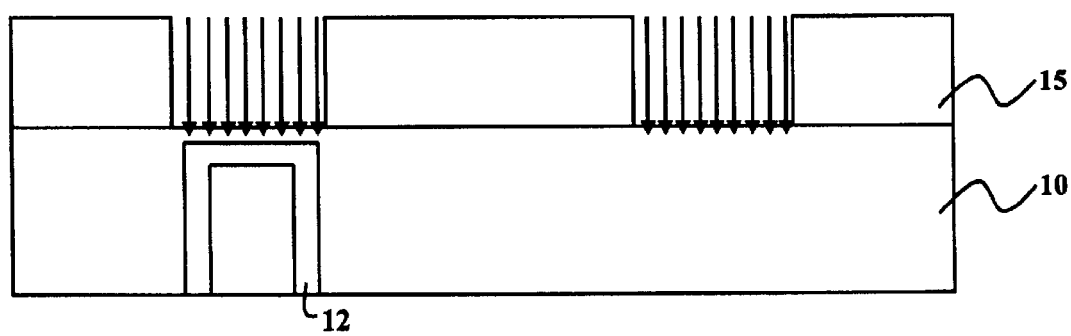
FIGS. 2(a) and 2(b) are schematic diagrams showing a cross-sectional segmented view of a device illustrating, in different steps of the fabrication process, a second embodiment of the invention.
Figure 2B:
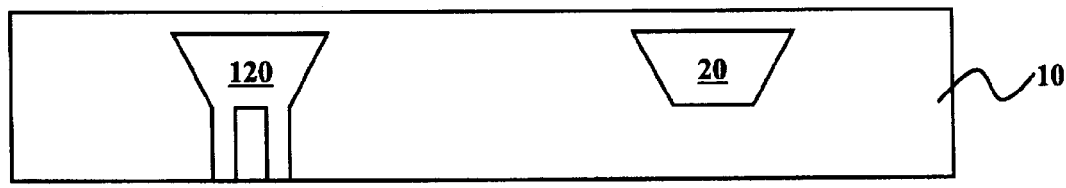

The patterned isolation layer 20 is used as a STI in the NPN region of the substrate 10, and a BOX (buried oxide layer) in the CMOS region (not shown). FIGS. 2(a) and 2(b) illustrate an alternative embodiment whereby the patterned isolation layer 120 is used as a deep trench isolation region 12 in one side of the NPN region of the substrate 10. The patterned isolation layer 20 on the other side of the device remains as a STI region. An advantage of the alternative embodiment includes reducing collector-to-substrate capacitance, thus enhancing device performances such as $f_{max}$, unit power gain cut-off frequency.

An example of the geometric configurations of the patterned isolation layer 20 is shown in FIGS. 4(a) and 4(b). For example, the lengths $L_1$ and $L_2$ of the patterned isolation layer 20 are approximately 750 nm and 980 nm, respectively, and the height $H_1$ of the patterned isolation layer 20 is approximately 180 nm. The distance $D_1$ of the undoped seed region between the isolation layer 20 and the surface of the substrate 10 is approximately 70 nm. The aforementioned geometric configurations are merely an example based on an experimental bipolar transistor device formed using the methodology according to the invention. The values provided are not to be construed as a limitation of the geometric configurations which may be practiced within the scope of the invention; rather the values are merely indicated as an example of a possible configuration which may be practiced according to the invention.

Figure 1E:
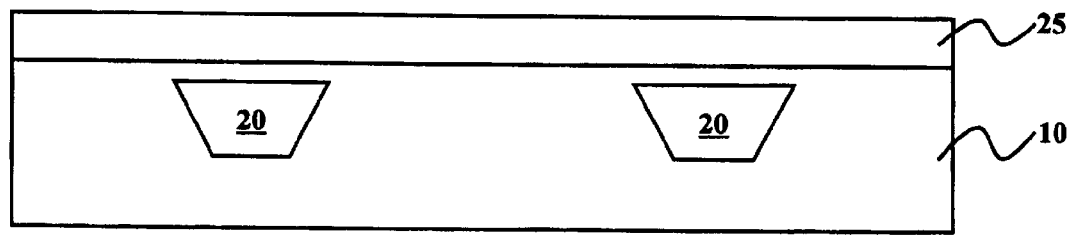
Figure 1F:
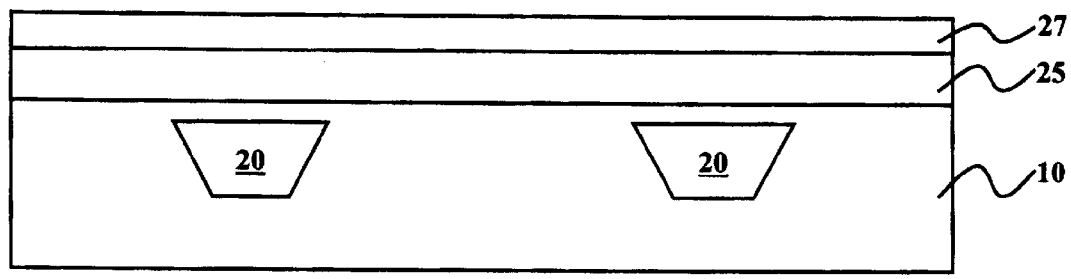
Figure 1G:
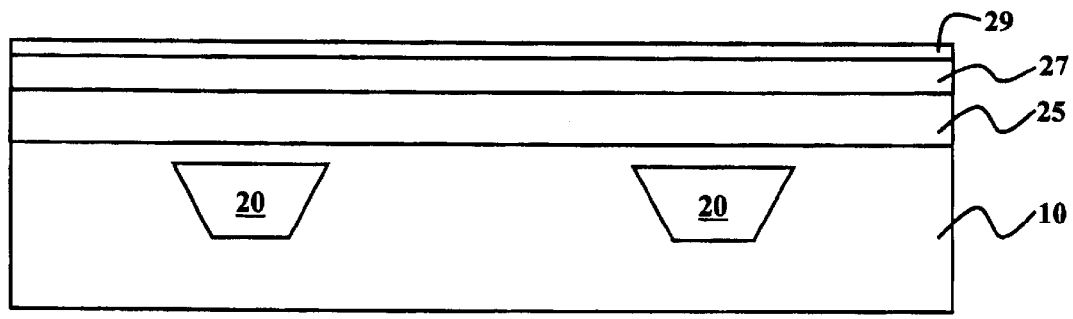
Figure 1H:
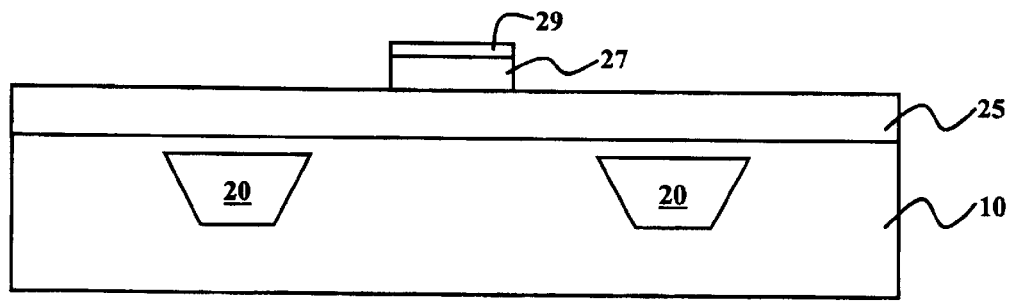
Figure 1I:
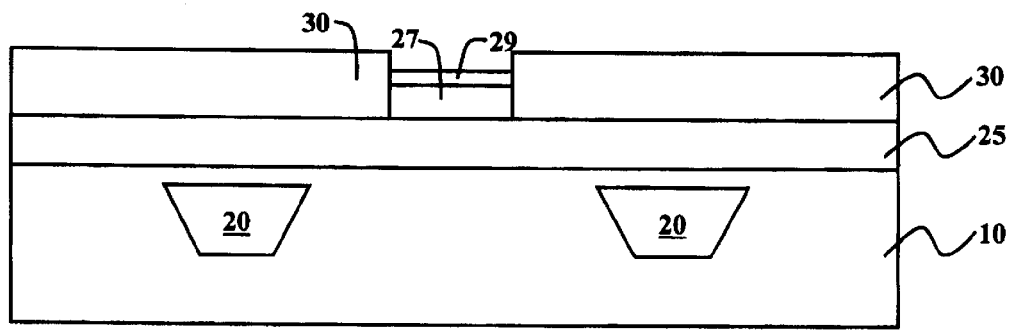
Figure 1J:
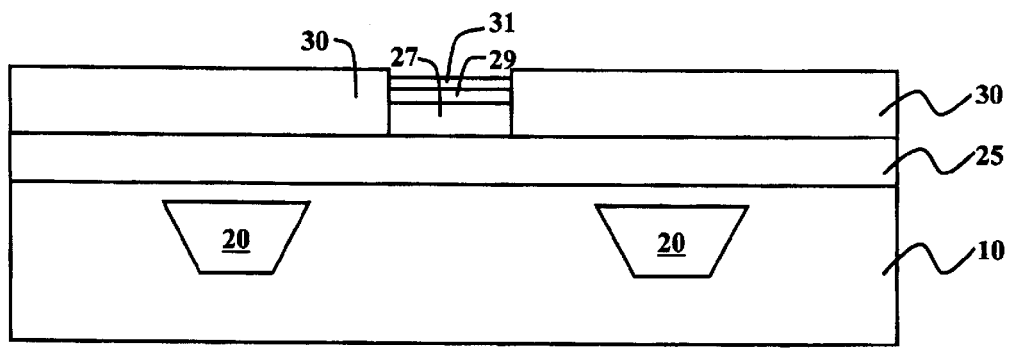

Next, as illustrated in FIG. 1(e) a LTE SiGe layer 25 is grown over the substrate 10. The LTE SiGe layer 25 is monocrystalline throughout and serves as the intrinsic base and portions of the extrinsic base of the device. FIGS. 1(f) and 1(g) show, respectively, a silicon dioxide pad layer 27 and a silicon nitride or other insulator layer 29 deposited over the SiGe layer 25. Thereafter, as depicted in FIG. 1(h), photolithography and directional etching such as reactive ion etching is performed over portions of the silicon dioxide layer 27 and silicon nitride layer 29 to define, what shall eventually become the emitter pedestal. The etched portions expose the underlying SiGe layer 25. As seen in FIG. 1(i), a second monocrystalline layer 30 is deposited over the exposed SiGe layer 25. The layered monocrystalline (merged layers 25 and 30) serve as the extrinsic base of the bipolar transistor, which controls conduction of electron injunction from the emitter 40 to the collector 60 to the sub-collector 50 (further shown in FIG. 1(r)). A polycrystalline polysilicon layer 29 is deposited over the silicon nitride layer 31 as shown in FIG. 1(j). The polycrystalline layer 29 is deposited at a much slower rate than the second monocrystalline layer 30. Moreover, the polycrystalline layer 29 is thinner than the second monocrystalline layer 30. For example, the deposition rate of the second monocrystalline layer 30 is 3 nm/min, while the deposition rate of the poly-crystalline layer 29 is 0.3 nm/min. Thus, as an example, the thickness of layer 30 is 100 nm, while layer 29 is 10 nm. The growth of the polycrystalline layer 29 is an inevitable because the growth starts from SiN or $SiO_2$ which is not single crystalline.

Figure 1K:
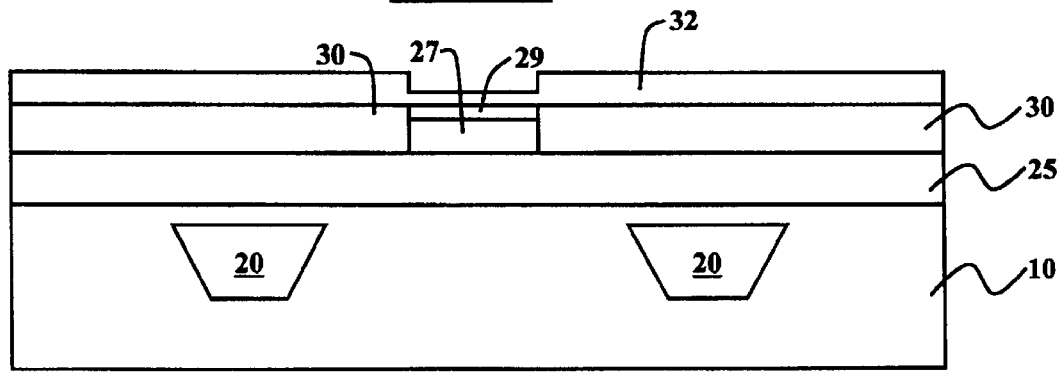
Figure 1L:
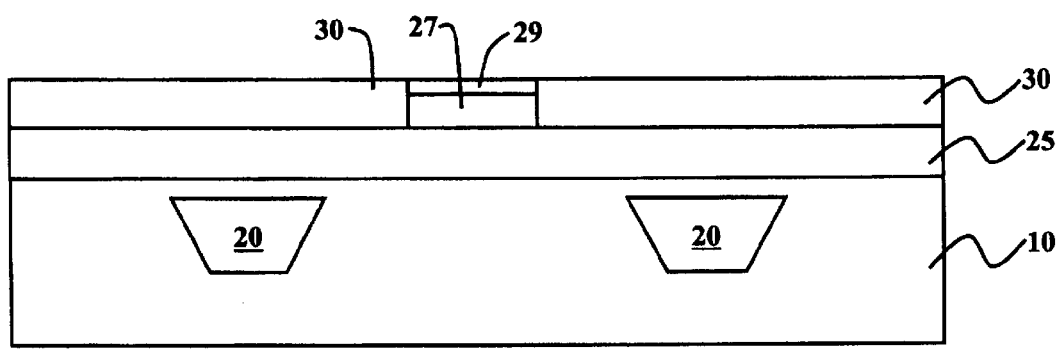
Figure 1M:
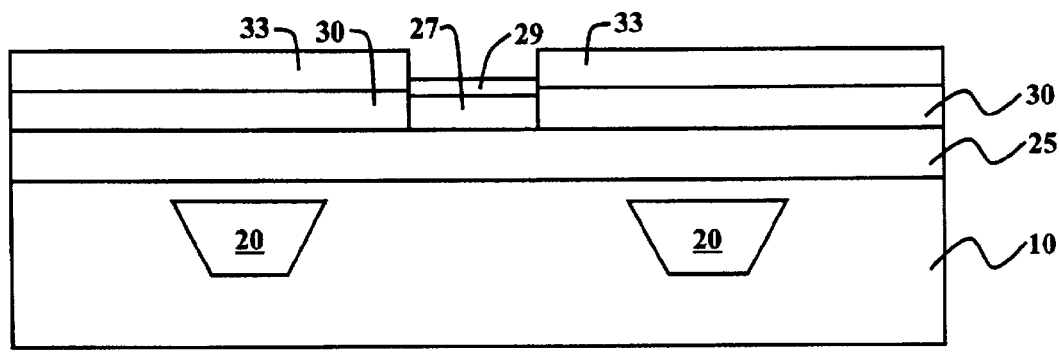

Next, in FIG. 1(k) HIPOX (High Pressure Oxidation) is performed whereby layer 32 is the silicon oxide layer that is converted from the polysilicon film 29 over the emitter. Here, thermal oxidation is carried out at the pressure of oxidizing ambient significantly higher than atmospheric pressure (e.g. 25 atm.), which allows fast growth of an oxide at reduced temperature. Then, the oxide layer 32 is removed as shown in FIG. 1(l). Next, FIG. 1(m) illustrates a second HIPOX layer 33 is converted from part of layer 30 outside the emitter pedestal region of emitter-base isolation. Thus, oxide 33 remains over the second monocrystalline layer 30.

Figure 1N:
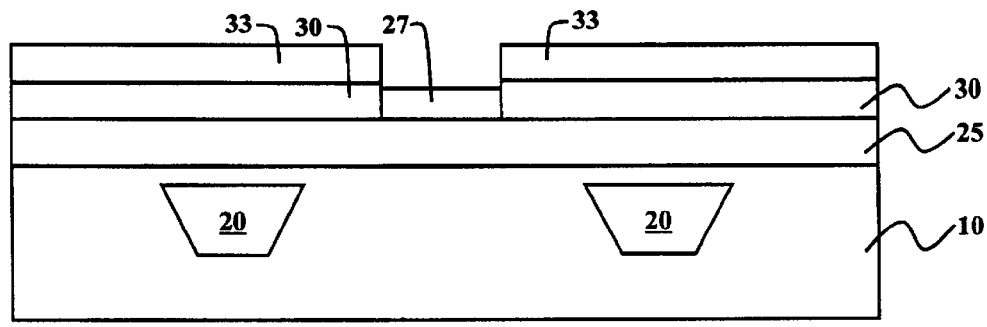
Figure 1O:
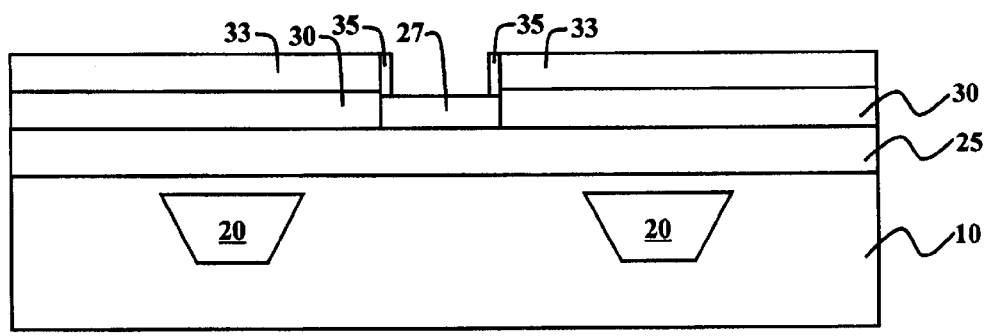

A hot phosphate process is performed to remove the nitride layer 29 in the emitter pedestal as shown in FIG. 1(n). This process aids in providing a self-aligned emitter opening. Next, as illustrated in FIG. 1(o) a pair of nitride spacers 35 is formed on opposite sides of the emitter pedestal to further provide emitter-base isolation. The spacers 35 are formed over the silicon dioxide layer 27 and along the side walls of the oxide layer 33 and a portion of the second monocrystalline layer 33.

Figure 1P:
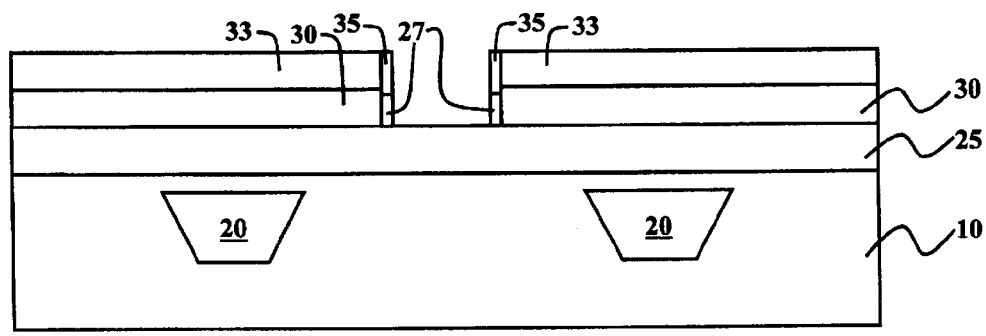
Figure 1Q:
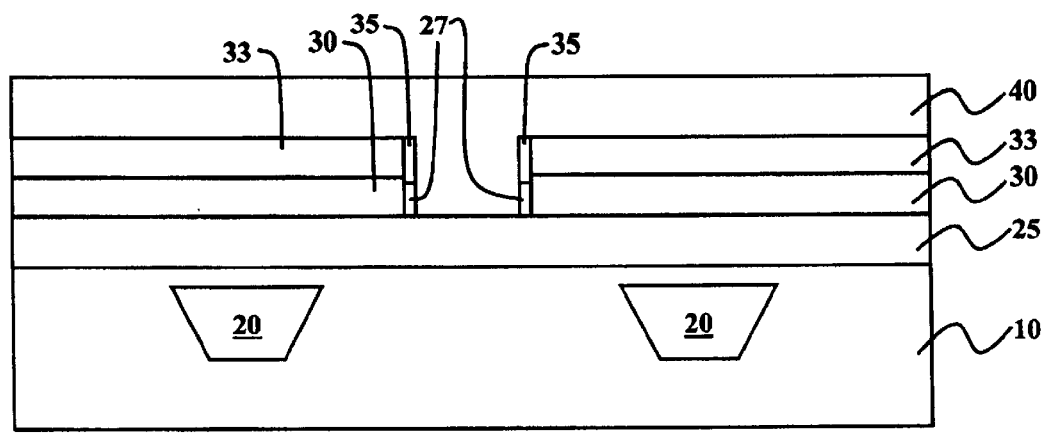

In FIG. 1(p) the exposed silicon dioxide layer 27 unprotected by the nitride spacers 35 are removed by a chemical oxide removal process to provide a pre-emitter clean. In FIG. 1(q) in -situ doped emitter deposition occurs by depositing arsenic or phosphorus to serve as the emitter 40 of the bipolar transistor.

Figure 1R:
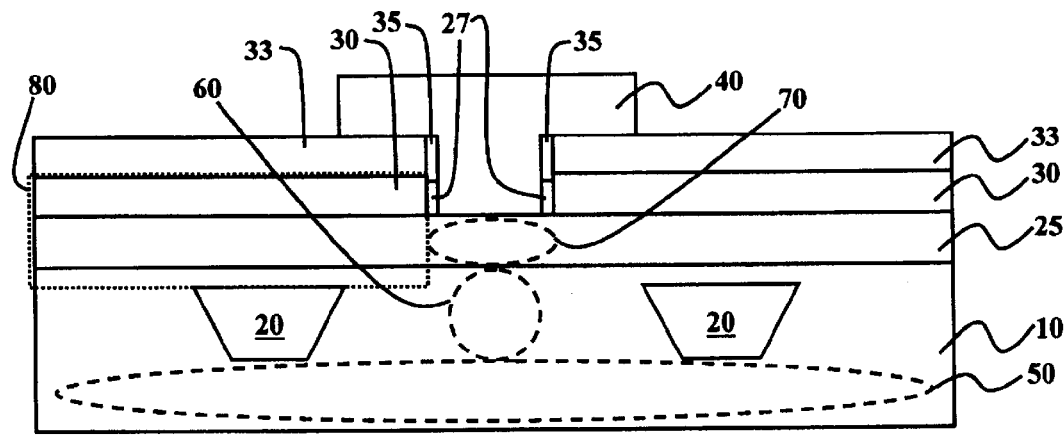

Photolithography and directional etching such as reactive ion etching is performed to define the emitter as illustrated in FIG. 1(r). The emitter 40, sub-collector 50, collector 60 are shown also shown in FIG. 1(r). Furthermore, the intrinsic base region 70 is illustrated in FIG. 1(r). As shown in FIG. 1(r) the intrinsic base region 70 is defined by that area underneath the emitter 40 and above the collector 60. During the manufacturing process, the intrinsic base 25 is formed first and then the extrinsic base 30 is formed above it. However, subsequently, the extrinsic base 30 merges with a portion of the intrinsic base 25 in the areas defined outside of the emitter-collector junction. Thus, for illustrative purposes, the intrinsic base region of the bipolar transistor is shown as region 70 in FIG. 1(r), however, those skilled in the art would recognize that portions of the intrinsic base 25 merges with the extrinsic base 30 outside of the defined area 70. Additionally, a portion of the substrate 10 above the isolation regions 20 (shown as $D_1$ in FIG. 4(b)) merges with the merged extrinsic base region (region 25 and 30 on the periphery of the intrinsic base region 70) shown as region 80 in FIG. 1(r). Further completion of the BiCMOS process occurs thereafter, which generally involves well-known processes such as chemical etching, photolithography and etching to define the base regions 25, 30 of the bipolar n-p-n devices, silicide formation at the base 25, 30 and collector 60 regions, boron phosphate silicon glass (BPSG) premetallization layer deposition, CMP planarization of the BPSG film, contact formation in the BPSG film, and back-end-of-line metallization.

Figure 3A:
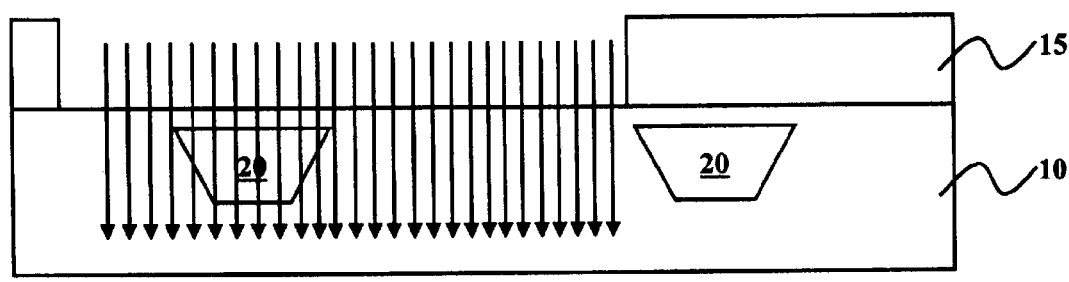
FIG. 3(a) is a schematic diagram showing a cross-sectional segmented view of a device illustrating a third embodiment of the invention.

FIGS. 3(a) and 3(b) illustrate various types of collector integration embodiments according to the invention. According to FIG. 3(a) the collector integration includes the entire bipolar area including underneath the isolation region 20, and further includes a sub-collector. This embodiment simplifies the conventionally used low-energy implanted sub-collector followed by n-epi growth process. Moreover, this embodiment can be either enabled before or after the SIMOX I/I (ion implantation) annealing process. In FIG. 3(b) a pedestal collector is formed, and is preferably performed prior to the SiGe LTE growth (which is shown in FIG. 1(e)) and/or after the emitter opening etch (shown in FIG. 1(o)). FIG. 3(a) shows a deep implanted collector and FIG. 3(b) illustrates a collector implanted into a smaller area prior to the SIMOX I/I annealing process.

Figure 5B:
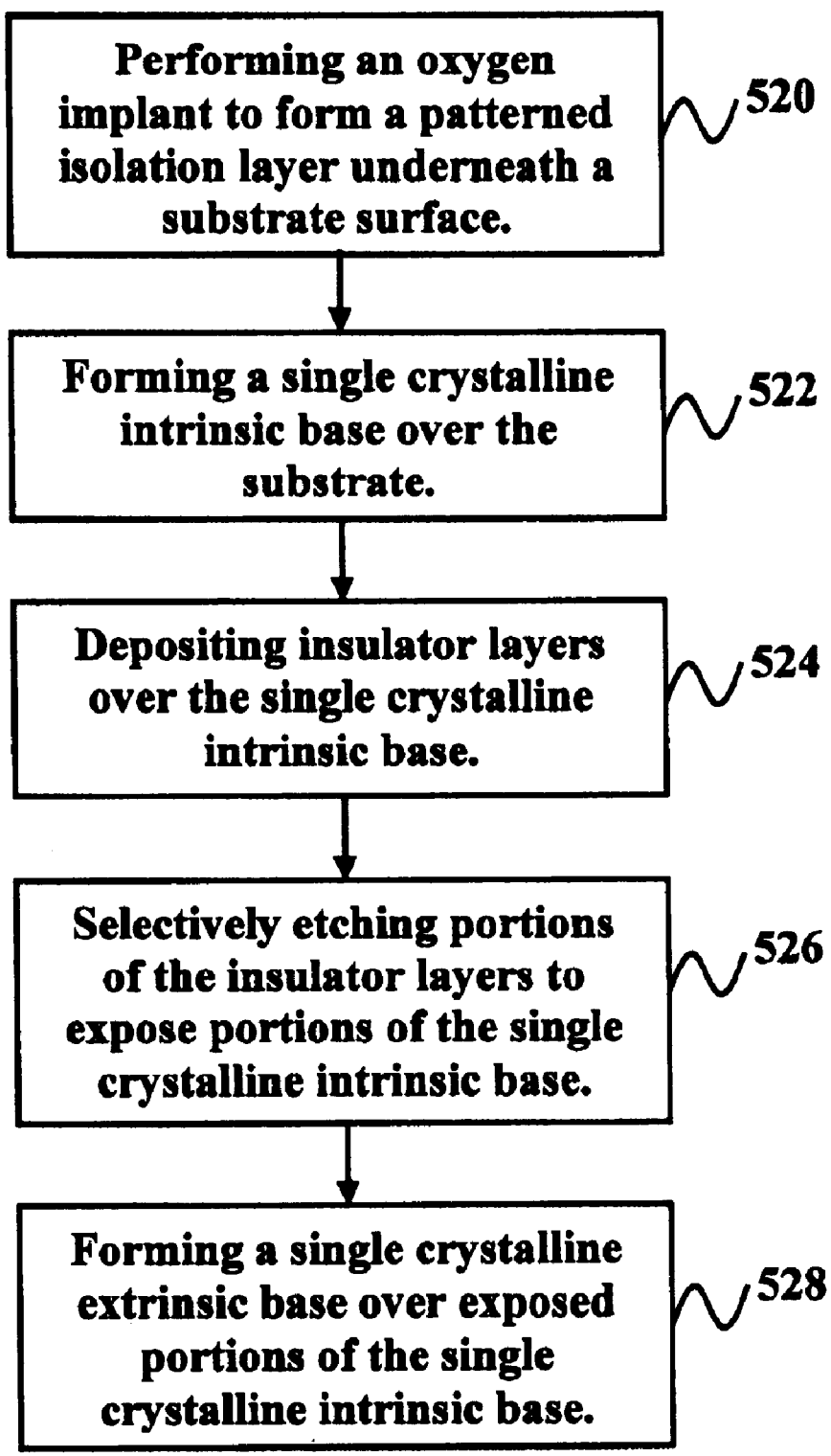

Flow diagrams illustrating preferred methods of the invention are shown in FIGS. 5(a) through 5(d). A general method of forming a bipolar transistor according to the invention is illustrated in FIG. 5(a), wherein the method comprises forming 500 an isolation region 20 below an upper surface of a semiconductor substrate 10, forming 502 a single crystal extrinsic base 30 on an upper surface of the isolation region 20, and forming 504 single crystal intrinsic base 25 over the semiconductor substrate 10.

A more detailed description of the method of manufacturing a bipolar transistor is illustrated in FIG. 5(b), wherein the method comprises performing 520 an oxygen implant to form a patterned isolation layer 20 underneath a substrate surface 10, forming 522 a single crystalline intrinsic base 25 over the substrate 10, depositing 524 insulator layers 27, 29 over the single crystalline intrinsic base 25, selectively etching 526 portions of the insulator layers 27, 29 to expose portions of the single transistor crystalline intrinsic base 25, and forming 528 a single crystalline extrinsic base 30 over exposed portions of the single crystalline intrinsic base 25.

Figure 5C:
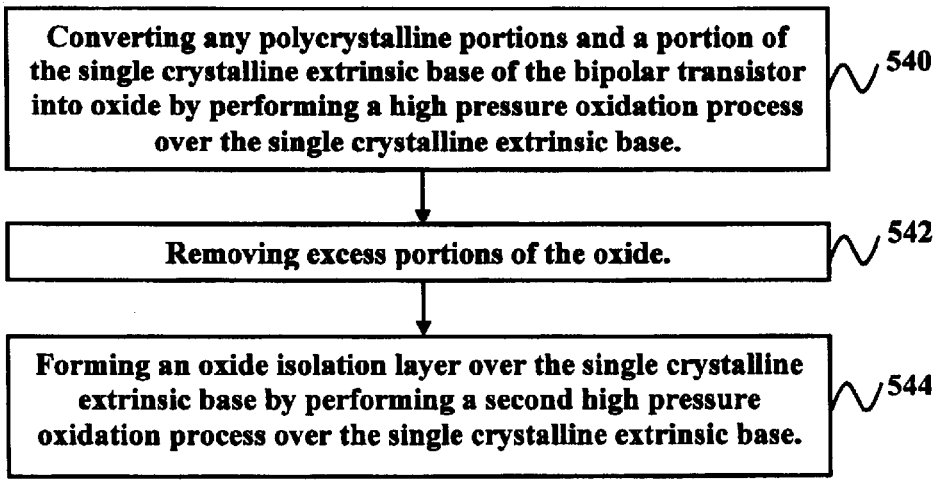

As shown in FIG. 5(c), the method further comprises converting 540 any polycrystalline portions and a portion of the single crystalline extrinsic base 30 of the bipolar transistor into oxide 32 by performing a high pressure oxidation process over the single crystalline extrinsic base 30, removing 542 excess portions of the oxide 32, and forming 544 an oxide isolation layer 33 over the single crystalline extrinsic base 30 by performing a second high pressure oxidation process over the single crystalline extrinsic base 30, wherein the insulator layers 27, 29 comprise a silicon nitride layer 29 deposited over a silicon dioxide layer 27.

Figure 5D:
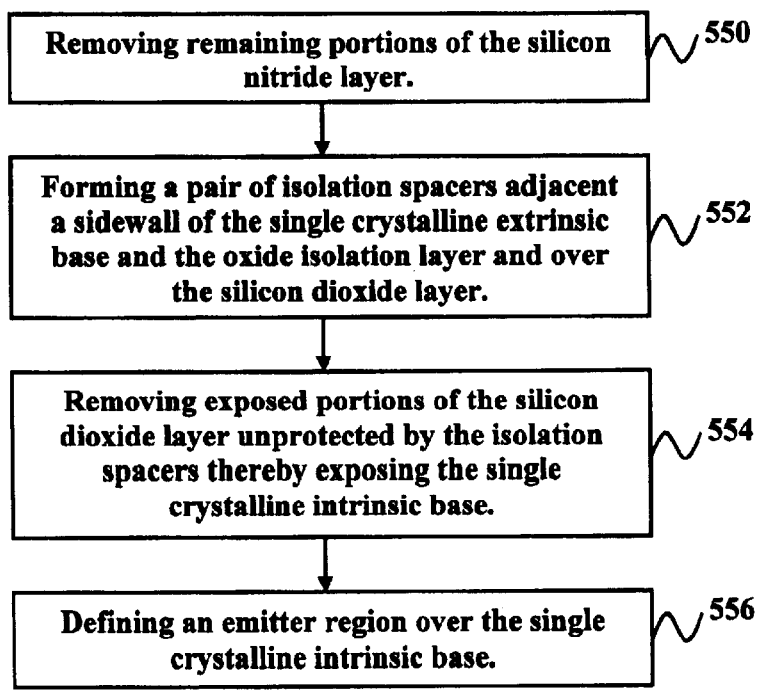

Moreover, as illustrated in FIG. 5(d), the method further comprises removing 550 remaining portions of the silicon nitride layer 29, forming 552 a pair of isolation spacers 35 adjacent a sidewall of the single crystalline extrinsic base 30 and the oxide isolation layer 33 and over the silicon dioxide layer 27, removing 554 exposed portions of the silicon dioxide layer 27 unprotected by the isolation spacers 35 thereby exposing the single crystalline intrinsic base 25, and defining 556 an emitter region 40 over the single crystalline intrinsic base 25, wherein the single crystalline extrinsic base 30 comprises a portion ($D_1$) of the substrate 10 located between an upper surface of the patterned isolation layer 20 and an upper surface of the substrate 10, and wherein a portion of the single crystalline extrinsic base 30 merges with a portion of the single crystalline intrinsic base 25, which further defines the intrinsic base 70 in the bipolar transistor.

The invention uses patterned SIMOX for BiCMOS isolation. This enables SiGe HBTs with planar structures. The invention achieves several advantages, such as a new and simple integration scheme that can be used for planar SiGe HBTs. Also, the invention achieves a much improved photolithography process on planar SiGe HBTs, especially as devices are scaled down. Moreover, the invention allows for reduced effect levels on planar SiGe HBTs and improves device yield. Moreover, according to the invention, CMOS are built at different regions on the same SIMOX wafers thereby providing a simple SiGe SOI technology.

Generally, the invention provides a bipolar transistor comprising an isolation region 20 formed below an upper surface of a semiconductor substrate 10 and a single crystal extrinsic base 30 formed on an upper surface of the isolation region 20. The single crystal extrinsic base 30 comprises a portion ($D_1$) of the semiconductor substrate 10 located between the upper surface of the isolation region 20 and the upper surface of the semiconductor substrate 10. The bipolar transistor further comprises a single crystal intrinsic base 25, wherein a portion of the single crystal extrinsic base 30 merges with a portion of the single crystal intrinsic base 25, which further defines the single crystal intrinsic base region 70 of the bipolar transistor. That is, the merged extrinsic base region (region 25 and 30 on the periphery of the intrinsic base region 70) help distinguish between the intrinsic base region 70 and the merged extrinsic base region (regions 25 and 30) located on opposite sides of the intrinsic base region 70. Thus, as shown in FIG. 1($r$), the merged area of the extrinsic base region is illustrated in the dotted area 80. Moreover, the isolation region 20 electrically isolates the single crystal extrinsic base 25 from a collector 60. Additionally, the single crystal intrinsic and extrinsic 25, 30 bases separate the collector 60 from an emitter 40. Furthermore, the single crystal extrinsic base 30 comprises epitaxially-grown silicon or silicon germanium or any other combination of there two layers. Also, the isolation region 20 comprises an insulator, wherein the insulator comprises oxide, and the isolation region 20 comprises any of a shallow trench isolation region and a deep trench isolation region.

More specifically, the bipolar transistor comprises a semiconductor substrate 10, a sub-collector 50 in the semiconductor substrate 10, a collector 60 adjacent the sub-collector 50, an isolation region 20 encapsulated within the semiconductor substrate 10, a single crystal extrinsic base 30 over the isolation region 20, and an emitter 40 adjacent the single crystal extrinsic base 30.

The invention provides a single crystalline extrinsic base (merged region 80), contrary to a polycrystalline extrinsic base found in conventional devices. More specifically, the single crystalline is extended to directly underneath the base contacts. As such, the invention provides a resulting planar geometry of the device. Also, because there is no transitional faceted region disposed in between the intrinsic and extrinsic bases 25, 30, the device performance is improved compared to the conventional devices.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A bipolar transistor comprising:
    a patterned isolation region formed below an upper surface of a semiconductor substrates; and
    a single crystal extrinsic base formed on an upper surface of said isolation region.

2. The bipolar transistor of claim 1, wherein said single crystal extrinsic base comprises a portion of said semiconductor substrate located between said upper surface of the isolation region and said upper surface of the semiconductor substrate.

3. The bipolar transistor of claim 1, further comprising a single crystal intrinsic base, wherein a portion of said single crystal extrinsic base merges with a portion of said single crystal / base.

4. The bipolar transistor of claim 1, wherein said isolation region electrically isolates said single crystal extrinsic base from a collector.

5. The bipolar transistor of claim 4, wherein said single crystal intrinsic and extrinsic bases separate said collector from an emitter.

6. The bipolar transistor of claim 1, wherein said single crystal extrinsic base comprises epitaxially-grown silicon.

7. The bipolar transistor of claim 1, wherein said isolation region comprises an insulator, and wherein said insulator comprises oxide.

8. The bipolar transistor of claim 1, wherein said isolation region comprises any of a shallow trench isolation region and a deep trench isolation region.

9. A bipolar transistor comprising:
    a semiconductor substrate;
    a sub-collector in said semiconductor substrate;
    a collector adjacent said sub-collector;
    a patterned isolation region encapsulated within said semiconductor substrate;
    a single crystal extrinsic base over said isolation region; and
    an emitter adjacent said single crystal extrinsic base.

10. The bipolar transistor of claim 9, wherein said single crystal extrinsic base comprises a portion of the semiconductor substrate located between an upper surface of the isolation region and an upper surface of the semiconductor substrate.

11. The bipolar transistor of claim 9, further comprising a single crystal intrinsic base, wherein a portion of said single crystal extrinsic base merges with a portion of said single crystal intrinsic base.

12. The bipolar transistor of claim 9, wherein said isolation region electrically isolates said single crystal extrinsic base from said collector.

13. The bipolar transistor of claim 12, wherein said single crystal intrinsic and extrinsic bases separate said collector from said emitter.

14. The bipolar transistor of claim 9, wherein said single crystal extrinsic base comprises epitaxially-grown silicon.

15. The bipolar transistor of claim 9, wherein said isolation region comprises an insulator, and wherein said insulator comprises oxide.

16. The bipolar transistor of claim 9, wherein said isolation region comprises any of a shallow trench isolation region and a deep trench isolation region.

17. A method of forming a bipolar transistor, said method comprising:

forming a patterned isolation region below an upper surface of a semiconductor substrate; and forming a single crystal extrinsic base on an upper surface of said isolation region.

18. The method of claim 17, wherein said single crystal extrinsic base comprises a portion of the semiconductor substrate located between said upper surface of the isolation region and said upper surface of the semiconductor substrate.

19. The method of claim 17, further comprising forming said single crystal intrinsic base over said semiconductor substrate, wherein a portion of said single crystal extrinsic base merges with a portion of said single crystal intrinsic base.

20. The method of claim 17, wherein said isolation region electrically isolates said single crystal extrinsic base from a collector.

21. The method of claim 20, wherein said single crystal intrinsic and extrinsic bases separate said collector from an emitter.

22. The method of claim 17, wherein said single crystal extrinsic base comprises epitaxially-grown silicon.

23. The method of claim 17, wherein said isolation region comprises an insulator, and wherein said insulator comprises oxide.

24. The method of claim 17, wherein said isolation region comprises any of a shallow trench isolation region and a deep trench isolation region.

25. A method of manufacturing a bipolar transistor, said method comprising:

performing an oxygen implant to form a patterned isolation layer underneath a substrate surface;

forming a single crystalline base over said substrate;

depositing insulator layers over said single crystalline intrinsic base;

selectively etching portions of said insulator layers to expose portions of said single crystalline intrinsic base; and forming a single crystalline base over exposed portions of said single crystalline intrinsic base.

26. The method of claim 25, wherein said single crystalline extrinsic base comprises a portion of the substrate located between an upper surface of the patterned isolation layer and an upper surface of the substrate.

27. The method of claim 25, wherein a portion of said single crystalline extrinsic base merges with a portion of said single crystalline intrinsic base.

28. A method of manufacturing a bipolar transistor, said method comprising:

performing an oxygen implant to form a patterned isolation layer underneath a substrate surface;

forming a single crystalline intrinsic base over said substrate;

depositing insulator layers over said single crystalline intrinsic base;

selectively etching portions of said insulator layers to expose portions of said single crystalline intrinsic base;

forming a single crystalline extrinsic base over exposed portions of said single crystalline intrinsic base;

converting any polycrystalline portions and a portion of said single crystalline extrinsic base of said bipolar transistor into oxide by performing a high pressure oxidation process over said single crystalline extrinsic base;

removing excess portions of said oxide; and forming an oxide isolation layer over said single crystalline extrinsic base by performing a second high pressure oxidation process over said single crystalline extrinsic base.

29. A method of manufacturing a bipolar transistor, said method comprising:

performing an oxygen implant to form a patterned isolation layer underneath a substrate surface;

forming a single crystalline intrinsic base over said substrate;

depositing insulator layers over said single crystalline intrinsic base;

selectively etching portions of said insulators layers to expose portions of said single crystalline intrinsic base;

forming a single crystalline extrinsic base over exposed portions of said single crystalline intrinsic base;

converting any polycrystalline portions and a portion of said single crystalline extrinsic base of said bipolar transistor into oxide by performing a high pressure oxidation process over said single crystalline extrinsic base;

removing excess portions of said oxide; and forming an oxide isolation layer over said single crystalline extrinsic base by performing a second high pressure oxidation process over said single crystalline extrinsic base, said insulator layers comprise a silicon nitride layer deposited over a silicon dioxide layer.

30. A method of manufacturing a bipolar transistor, said method comprising:

performing an oxygen implant to form a patterned isolation layer underneath a substrate surface;

forming a single crystalline intrinsic base over said substrate;

depositing insulator layers over said single crystalline intrinsic base;

selectively etching portions of said insulator layers to expose portions of said single crystalline intrinsic base;

forming a single crystalline extrinsic base over exposed portions of said single crystalline intrinsic base;

converting any polycrystalline portions and a portion of said single crystalline extrinsic base of said bipolar transistor into oxide by performing a high pressure oxidation process over said single crystalline extrinsic base;

removing excess portions of said oxide;

forming an oxide isolation layer over said single crystalline extrinsic base by performing a second high pressure oxidation process over said single crystalline extrinsic base, said insulator layers comprise a silicon nitride layer deposited over a silicon dioxide layer; further comprising:

removing remaining portions of said silicon nitride layer;

forming a pair of isolation spacers adjacent a sidewall of said single crystalline extrinsic base and said oxide isolation layer and over said silicon dioxide layer;

removing exposed portions of said silicon dioxide layer unprotected by said isolation spacers thereby exposing said single crystalline intrinsic base; and defining an emitter region over said single crystalline intrinsic base.

* * * * *